(12) United States Patent
Chopra

(10) Patent No.: US 6,545,357 B2
(45) Date of Patent: Apr. 8, 2003

(54) METAL NITRIDE BARRIER LAYER AND ELECTROPLATING SEED LAYER WITH THE SAME METAL AS THE METAL NITRIDE LAYER

(75) Inventor: Dinesh Chopra, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/853,451

(22) Filed: May 9, 2001

(65) Prior Publication Data

US 2002/0030274 A1 Mar. 14, 2002

Related U.S. Application Data

(62) Division of application No. 09/384,347, filed on Aug. 27, 1999.

(51) Int. Cl.[7] .......................... H01L 23/48; H01L 23/52; H01L 29/40
(52) U.S. Cl. ....................................................... 257/751
(58) Field of Search ................................. 257/486, 740, 257/751, 767, 438, 750, 758

(56) References Cited

U.S. PATENT DOCUMENTS

| | | | |
|---|---|---|---|
| 5,098,526 A | | 3/1992 | Bernhardt |
| 5,147,819 A | | 9/1992 | Yu et al. |
| 5,389,575 A | | 2/1995 | Chin et al. |
| 5,480,814 A | | 1/1996 | Wuu et al. |
| 5,525,837 A | * | 6/1996 | Choudhury ................. 257/751 |
| 5,550,084 A | | 8/1996 | Anjum et al. |
| 5,668,411 A | * | 9/1997 | Hong et al. ................. 257/751 |
| 5,719,446 A | * | 2/1998 | Taguchi et al. ............. 257/751 |
| 5,847,459 A | * | 12/1998 | Taniguchi ................... 257/751 |
| 5,847,463 A | * | 12/1998 | Trivedi et al. .............. 257/751 |
| 5,856,707 A | * | 1/1999 | Sardella ...................... 257/758 |
| 5,883,433 A | * | 3/1999 | Oda ............................ 257/750 |
| 5,893,752 A | * | 4/1999 | Zhang et al. ................ 438/687 |
| 5,903,054 A | * | 5/1999 | Sardella ...................... 257/751 |
| 5,933,758 A | * | 8/1999 | Jain ............................ 438/687 |
| 5,939,788 A | * | 8/1999 | McTeer ....................... 257/751 |
| 5,968,333 A | | 10/1999 | Nogami et al. |
| 6,069,068 A | | 5/2000 | Rathore et al. |
| 6,100,194 A | | 8/2000 | Chan et al. |
| 6,140,231 A | | 10/2000 | Lin et al. |
| 6,174,799 B1 | | 1/2001 | Lopatin et al. |
| 6,217,721 B1 | | 4/2001 | Xu et al. |

FOREIGN PATENT DOCUMENTS

EP  0 297 502 A2  1/1989

OTHER PUBLICATIONS

S. Wolf and R.N. Tauber, Silicon Processing for the VLSI Era, 2000, Lattice Press, vol. 1, 782–783.*

* cited by examiner

Primary Examiner—Carl Whitehead, Jr.
Assistant Examiner—Monica Lewis
(74) Attorney, Agent, or Firm—Knobbe, Martens, Olson & Bear, LLP

(57) ABSTRACT

A barrier layer material and method of forming the same is disclosed. The method includes depositing a graded metal nitride layer in a single deposition chamber, with a high nitrogen content at a lower surface and a high metal content at an upper surface. In the illustrated embodiment, a metal nitride with a 1:1 nitrogen-to-metal ratio is initially deposited into a deep void, such as a via or trench, by reactive sputtering of a metal target in nitrogen atmosphere. After an initial thickness is deposited, flow of nitrogen source gas is reduced and sputtering continues, producing a metal nitride with a graded nitrogen content. After the nitrogen is stopped, deposition continues, resulting in a substantially pure metal top layer. This three-stage layer includes a highly conductive top layer, upon which copper can be directly electroplated without a separate seed layer deposition. Advantageously, native oxide on the top metal surface can be cleaned in situ by reversing polarity in the electroplating solution just prior to plating.

22 Claims, 5 Drawing Sheets

METAL NITRIDE BARRIER LAYER AND ELECTROPLATING SEED LAYER WITH THE SAME METAL AS THE METAL NITRIDE LAYER

This application is a divisional of prior application Ser. No. 09/384,347, filed Aug. 27, 1999.

FIELD OF THE INVENTION

The present invention relates in general to a barrier/seed layer in an integrated circuit, over which metal can be directly electroplated, and methods of making the same. More particularly, the invention relates to an in situ formed metal nitride barrier layer and metal seed layer for electroplating copper within vias or trenches.

BACKGROUND OF THE INVENTION

When fabricating integrated circuits (IC), layers of insulating, conducting and semiconducting materials are deposited and patterned. Contact vias or openings are commonly formed in insulating materials known as interlevel dielectrics (ILDs). The vias are then filled with conductive material, thereby interconnecting electrical devices and wiring at various levels. Damascene processing similarly involves etching trenches in insulating layers in a desired pattern for a wiring layer. These trenches are then filled with conductive material to produce the integrated wires. Where contact vias, extending downwardly from the bottom of the trenches, are simultaneously filled, the process is known as dual damascene.

Conductive elements, such as gates, capacitors, contacts, runners and wiring layers, must each be electrically isolated from one another for proper IC operation. In addition to interlevel dielectrics surrounding contacts, care must be taken to avoid conductive diffusion and spiking, which can cause undesired shorts between devices and contacts. Protective barriers are often formed between via or trench walls and metals in a substrate assembly, to aid in confining deposited material within the via or trench walls. Barriers are thus useful for damascene and dual damascene interconnect applications, particularly for small, fast-diffusing elements such as copper. Barriers also have application over transistor active areas and other circuit elements from or to which dopants tend to migrate during high temperature processing.

Candidate materials for protective barriers should foremost exhibit effective diffusion barrier properties. Additionally, the materials should demonstrate good adhesion with adjacent materials (e.g., oxide via walls, metal fillers). For many applications, a barrier layer is positioned in a current flow path and so must be conductive. Typically, barriers have been formed of metal nitrides ($MN_x$) such as titanium nitride (TiN) or tungsten nitride (WN), which are dense, amorphous and adequately conductive for lining contact vias and other conductive barrier applications.

These lined vias or trenches are then filled with metal by any of a variety of processes, including chemical vapor deposition (CVD), physical vapor deposition (PVD), forcefill, hot metal reflow, etc. These methods attempt to completely fill deep, narrow openings without forming voids or keyholes. More recently, processing advancements have enabled the employment of copper as an interconnect material, taking advantage of its low resistivity. Typically, copper is electroplated over the substrate surface in order assure adequate filling of deep vias or trenches.

It is difficult, however, to satisfactorily electroplate copper (Cu) directly over the metal nitride barriers. Although metal nitrides can be sufficiently conductive for circuit operation, where current flows through the thickness of the barrier layer, lateral conductivity across such layers is inconsistent. High sheet resistivity makes it difficult to maintain an equipotential surface. Accordingly, a seed layer of copper is typically first deposited over the barrier, such as by PVD, and the workpiece is then transferred to an electroplating bath to complete the deposition. The seed layer thus represents an additional processing step, adding significantly to process overhead.

Accordingly, there is a need for improved processes and materials for protective barriers in integrated circuits. Desirably, such processes should also be compatible with conventional fabrication techniques, and thereby easily integrated with existing technology.

SUMMARY OF THE INVENTION

In accordance with one aspect of the invention, a method is provided for fabricating an integrated circuit. The method includes loading a semiconductor workpiece into a chamber and providing a metal source and a supply of nitrogen source gas to the chamber. A conductive barrier layer is deposited on the workpiece within the chamber from the metal source and the nitrogen source gas. The supply of nitrogen source gas is reduced while depositing the barrier layer.

In accordance with another aspect of the invention, a method is provided for forming a conductive structure in an opening in a partially fabricated integrated circuit. The opening can be, for example, a contact via or a wiring trench. A metal target is sputtered in the presence of an amount of nitrogen source gas, thereby forming a metal nitride layer in the opening. The amount of nitrogen source gas is reduced during the process. After reducing the amount of nitrogen source gas the metal target is further sputtered to form a substantially metal layer over the metal nitride layer in the opening. A second metal is then electroplated onto the top surface of the metal layer.

In accordance with another aspect of the present invention a method is provided for forming a wiring element with a barrier/seed layer in an integrated circuit. The method includes depositing an initial metal nitride layer, having a first nitrogen content, into an opening in an interlevel dielectric. A second metal nitride layer is deposited directly onto the initial metal nitride layer and has a second nitrogen content lower than the first nitrogen content. A substantially metal seed layer is then deposited directly onto the second metal nitride layer, and copper directly electroplated onto the substantially metal seed layer.

In accordance with another aspect of the invention, a protective barrier is interposed between a highly conducting metallic element in an integrated circuit and an interlevel dielectric. The barrier includes a metallic nitride sub-layer. A nitrogen content in the metallic nitride is graded from a first concentration adjacent the interlevel dielectric to about zero adjacent the metallic element.

In accordance with another aspect of the invention, an integrated circuit includes a wiring structure within an opening of an insulating layer. The wiring structure includes a barrier portion, which in turn includes at least one metal nitride sub-layer. A metal sub-layer directly overlies the barrier portion and has the same metal as the metal nitride sub-layer. A copper layer directly overlies the at least one metal sub-layer.

BRIEF DESCRIPTION OF THE DRAWINGS

These and other aspects, features and advantages of this invention will be apparent from the detailed description of the preferred embodiment and the accompanying drawings, which are intended to illustrate and not to limit the invention. Like reference numerals are employed to designate like parts throughout the figures, wherein.

DETAILED DESCRIPTION OF THE PREFERRED EMBODIMENT

The preferred embodiments are illustrated in the context of metallization processes in an integrated circuit, including contact stud formation and damascene processes, where a barrier layer lines a void and copper is electroplated thereover. The skilled artisan will readily appreciate, however, that the materials and methods disclosed herein will have application in a number of other contexts where a barrier layer is desirable, particularly where lateral conductivity through the barrier is important.

Conventional via or trench barriers comprise metal nitrides, such as titanium nitride (TiN) and tungsten nitride ($WN_x$). Chemical vapor deposition processes have been developed for some such materials, and physical vapor deposition (e.g., sputtering) is utilized for others. Metal suicides ($MSi_x$) and ternary compounds ($MSi_xN_y$) can also be employed in addition to or in place of metal nitrides for more effective adhesion to insulating material of the via or trench sidewalls, and for ohmic contact with underlying circuit elements.

Figure 1:
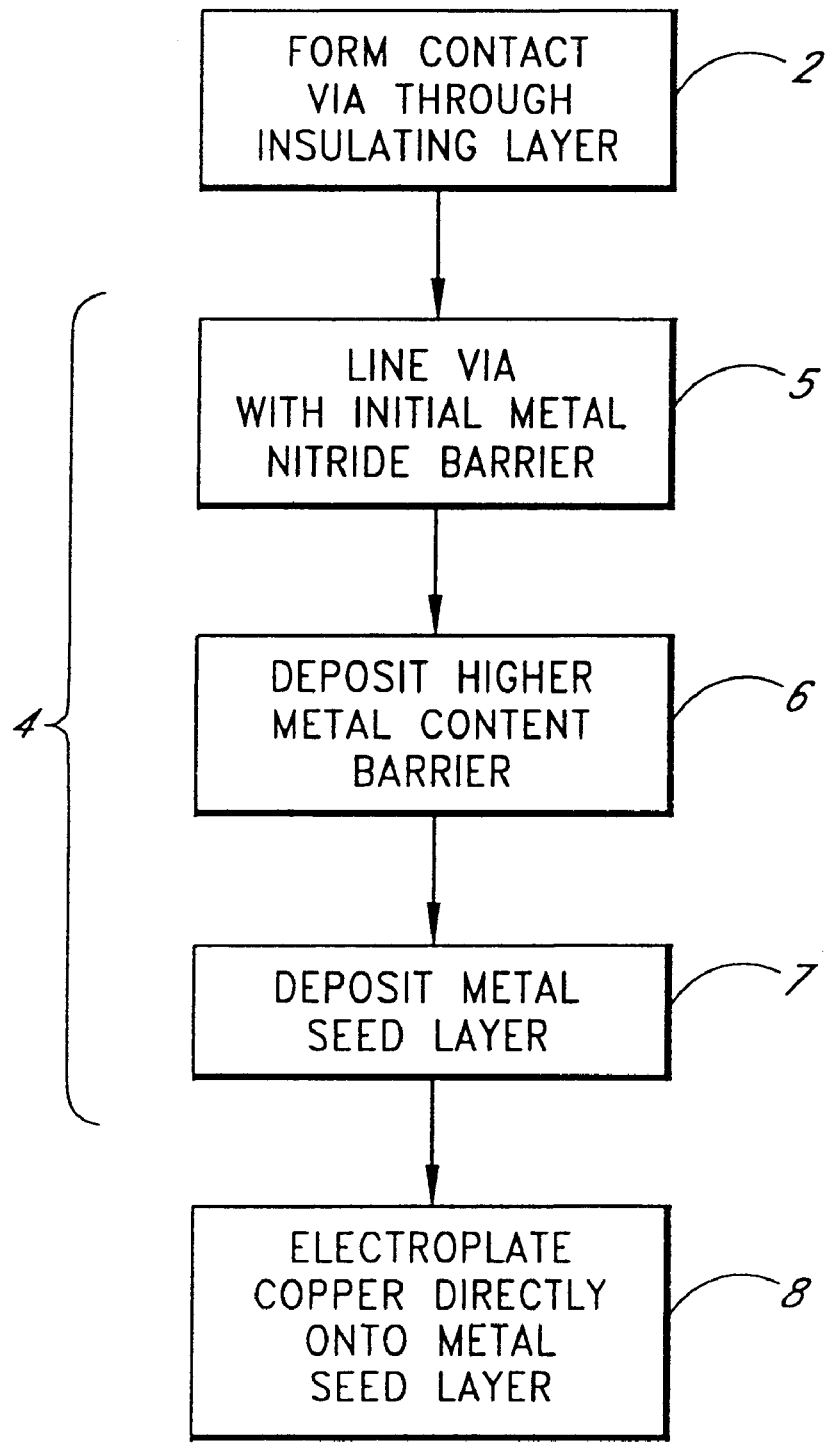
FIG. 1 is a flow diagram illustrating a process for forming a conductive barrier/seed layer and electroplating metal directly thereover, in accordance with a preferred embodiment of the present invention.

FIG. 1 schematically illustrates a process flow for forming a barrier/seed layer over which metal can be directly electroplated in accordance with a preferred embodiment of the invention. As shown, the process begins with a contact via formation 2 through an insulating layer. It will be understood that the same process may be applied to trenches, such as in damascene metallization process flows.

Following the contact via formation 2, a barrier/seed layer is formed within the via. For purposes of illustration, the barrier/seed formation 4 is broken into three phases 5–7. It will be understood from the description below, however, that the barrier/seed formation 4 preferably constitutes a single fabrication process conducted in situ in the same process chamber.

The barrier/seed formation 4 thus includes first lining phase 5 the via with an initial metal nitride layer or initial barrier sub-layer. In the following phase 6, a second metal nitride layer, or second barrier sub-layer is then applied, preferably having a greater metal content than the initial barrier sub-layer, and more preferably having a graded metal content. A metal seed layer or third barrier sub-layer is then formed over the previous sub-layers as the third phase 7. This metal seed layer is preferably substantially metal. The structure may be optionally precleaned, as discussed in more detail below. Copper or other metal is electroplated 8 directly onto the metal seed layer.

As noted, all sub-layers of the barrier/seed layer are preferably formed sequentially in a single processing tool, more preferably in a continuous deposition process. Hereinafter, the barrier/seed formation 4 is also referred to as deposition 4. Most preferably, the tool comprises a PVD, and more preferably a sputtering tool, and the deposition comprises reactive sputtering. The skilled artisan will readily appreciate, however, that the principles disclosed herein can be applied to other types of deposition, such as chemical vapor deposition.

Note that, in the present the disclosure, the layer can alternatively be referred to as a barrier/seed layer, and barrier and seed layer, or a barrier layer including a seed layer. This is due to the fact that, from a fabrication viewpoint, all three sub-layers are formed, preferably continuously, in the same process tool. From a functional viewpoint, the topmost metallic (substantially nitrogen-free) layer serves an electroplating seed function, while the lower sub-layer(s) serve a barrier function. From a structural viewpoint, the various sub-layers can be distinguished from one another by, for example, XPS analysis.

Sputtering in accordance with the illustrated embodiment is conducted in any suitable chamber, and the illustrated embodiment employs a DC magnetron sputtering chamber (not shown), such as is commercially available under the trade name Endura 5500 PVD II™, from Applied Materials, Inc. of Santa Clara, Calif. The skilled artisan will recognize that other sputtering equipment can also be used. The chamber houses a target cathode and pedestal anode. In other arrangements, the chamber walls can form the anode.

The target cathode is preferably metallic, such as tungsten (W), tantalum (Ta), titanium (Ti), tantalum silicide ($TaSi_x$), titanium silicide ($TiSi_x$), etc., and more preferably comprises a "pure" (greater than 99% pure) metal target. In the illustrated embodiment, a pure W target is employed.

A gas inlet into the chamber includes a heavy inert gas, preferably argon, for bombarding the target when a plasma is activated within the chamber. Additionally, a nitrogen source gas, preferably nitrogen ($N_2$) or ammonia ($NH_3$), is also introduced to the chamber during deposition. A further carrier gas, such as hydrogen gas ($H_2$) is preferably also introduced into the sputtering chamber to aid in supporting an active plasma within the chamber.

A workpiece 10 (FIGS. 2–7) is mounted in the sputtering chamber. In the preferred embodiment, argon gas flows into the chamber at a rate of between about 10 sccm and 100 sccm, more preferably between about 25 sccm and 50 sccm. $N_2$ gas flow preferably starts during initial stages of deposition between about 10 sccm and 50 sccm, more preferably between about 15 sccm and 25 sccm, and is preferably reduced to about zero flow by the end of the deposition 4. The preferred chamber operates at a power preferably of about 1 kW to 3.5 kW, and a pressure preferably of at least about 0.1 mTorr, more preferably at about 0.5 mTorr to 20 mTorr. The skilled artisan will readily appreciate that these parameters can be adjusted for sputtering chambers of different volumes, electrode areas and electrode spacing.

Figure 8:
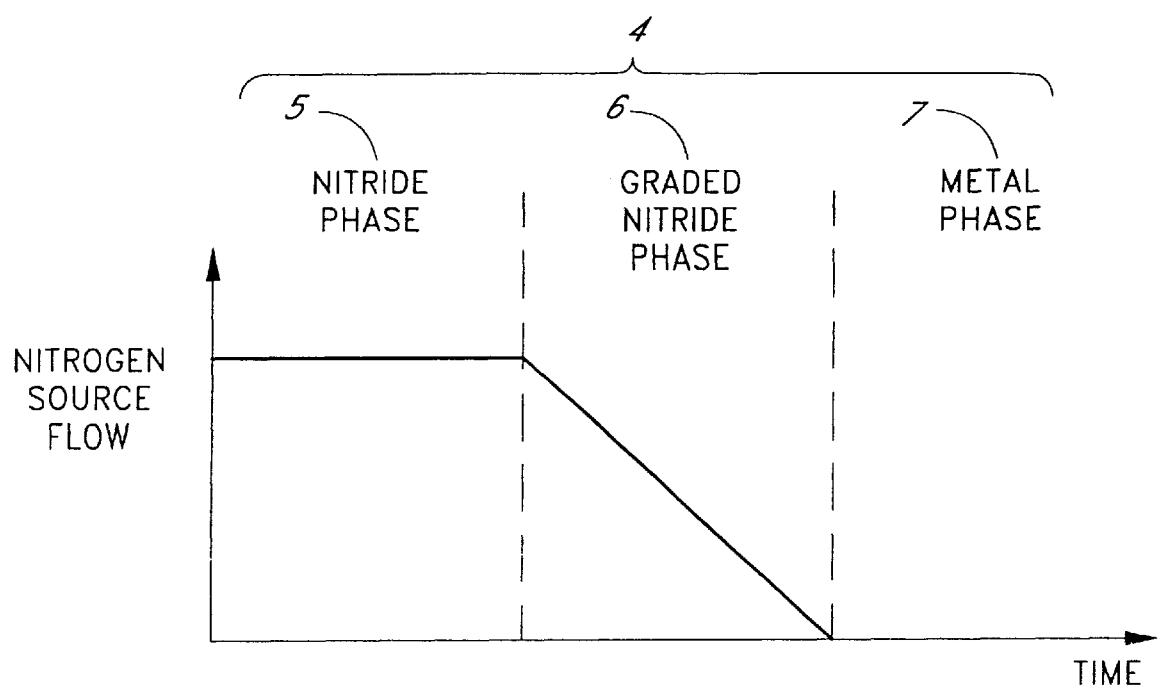
FIG. 8 graphically depicts a nitrogen source gas flow rate during in situ formation of the barrier sub-layers.

FIG. 8 shows relative nitrogen source gas flow rates during the preferred three phases 5–7 of depositing 4 the barrier/seed layer. Sputtering conditions (i.e., power, argon and carrier flow, pressure) are maintained relatively constant during the process 4. As shown, however, the nitrogen source gas is reduced during the process, preferably to zero by the end of the deposition 4.

In the illustrated embodiment, the initial phase 5 comprises the highest flow rate. Under the preferred sputtering conditions described above, Ar ions strike the W target, liberating tungsten atoms and causing an initial barrier sub-layer 20 (FIG. 3) to form on the substrate 18. Due to the presence of the nitrogen source gas ($N_2$ in the illustrated embodiment), the sputtered film incorporates nitrogen in a process known as reactive sputtering. Deposition under these conditions is preferably conducted for a time period sufficient to form the thickness as described hereinbelow with respect to FIG. 3. The high nitrogen source flow rate produces a film in which the ratio of nitrogen to tungsten in the resultant film is preferably greater than about 1:2, and more preferably about 1:1. The initial sub-layer 20 thus preferably comprises a stoichiometric metal nitride. It will be understood, of course, that the nitride can comprise a ternary compound (e.g., $TaSi_xN_y$ or $TaSi_xN_y$) where the metallic target comprises a metal silicide.

The second phase 6 of deposition 4 is conducted without removing the workpiece from the sputtering chamber. Preferably, sputtering continues while the nitrogen source gas flow rate is reduced.

In the illustrated embodiment, the flow of nitrogen source gas is reduced linearly with time from the level during the initial phase 5 down to zero. It will be understood that, in other arrangements, the nitrogen gas source can be reduced in a nonlinear fashion, decreasing the amount of nitride deposited on the substrate assembly 10 in a parabolic, hyperbolic, other exponential or stepped manner. The second phase 6 preferably continues for a time period sufficient to form the thickness as described hereinbelow with respect to FIG. 4. The nitrogen content in the resultant film is thus preferably graded from a high level at the lower surface (merging with the initial barrier sub-layer) to about zero at the top surface.

The third phase 7 of deposition 4 is also conducted without removing the workpiece from the sputtering chamber. Preferably, sputtering continues while the nitrogen source gas flow is shut off. Accordingly, simple metal sputtering results in substantially pure metal sub-layer. The third phase 7 preferably continues for a time period sufficient to form the thickness as described hereinbelow with respect to FIG. 5.

TABLE

|  | Ar Gas Flow (sccm) | $N_2$ Gas Flow (sccm) | Pressure (mTorr) | Power (kW) |
|---|---|---|---|---|
| Initial Sub-layer | 50 | 20 | 25 | 1.0 |
| Second Sub-layer | 50 | 20 to 0 | 25 | 1.0 |
| Seed sub-layer | 50 | 0 | 25 | 1.0 |

FIGS. 2–7 illustrate structures that result from the process described and shown in FIGS. 1 and 8.

Figure 2:
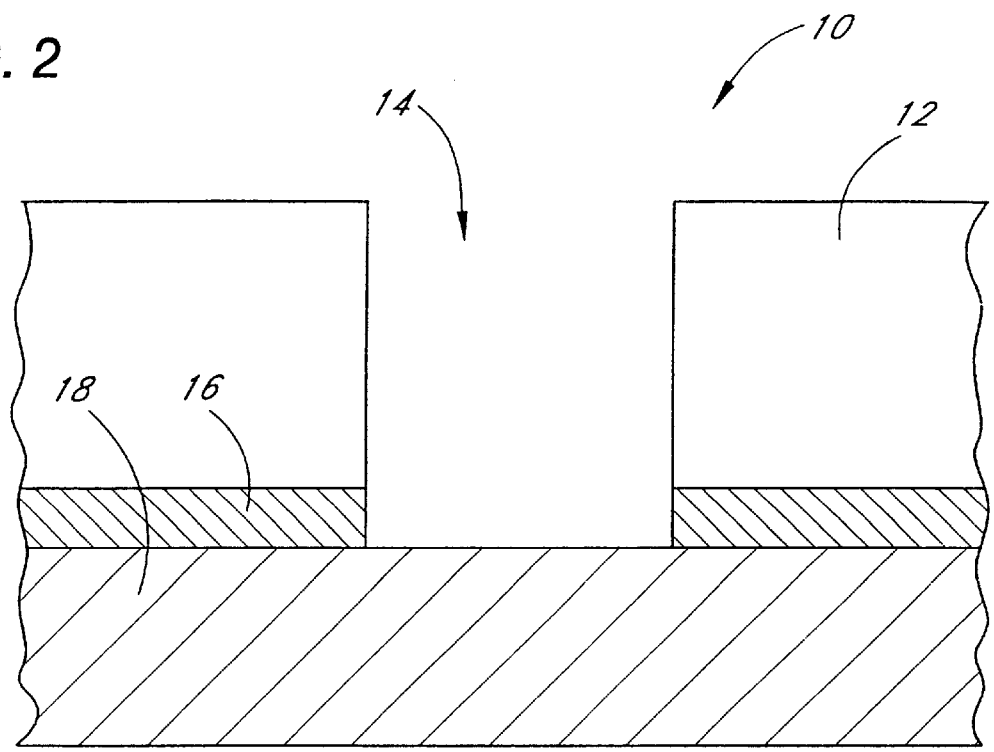
FIG. 2 is a partial elevational cross-section of a partially fabricated integrated circuit or substrate assembly, showing a conventional interlevel dielectric and a contact via therethrough, exposing a conductive circuit element beneath the via.

With reference initially to FIG. 2, a partially fabricated integrated circuit is shown on a workpiece or substrate assembly 10. The structure is formed above a substrate (not shown), which may comprise a single-crystal silicon wafer or other semiconductor layer in which active or operable portions of electrical devices are formed. An interlevel dielectric (ILD) 12 is formed above the substrate. Typical ILD materials include oxides formed from tetraethylorthosilicate (TEOS), borophosphosilicate glass (BPSG), polyamide, etc., and the illustrated ILD 12 comprises BPSG. The ILD 12 has a thickness adequate to electrically insulate underlying conductors from overlying conductors, which depends upon circuit design and operational parameters. In the illustrated embodiment, where the substrate assembly represents a 64 Mbit dynamic random access memory (DRAM) circuit, the ILD 12 preferably has a thickness between about 0.40 μm and 0.60 μm.

An opening is etched through the ILD 12 to expose an underlying conductive circuit element. In the illustrated embodiment, the opening comprises an intermetal contact via 14, though in other arrangements the opening can comprise a contact opening to the substrate or a wiring trench. For current state-of-the-art circuit designs, the via 14 has a width of less than about 0.25 μm, more preferably less than about 0.20 μm. Such narrow dimensions result in aspect ratios (height: width) greater than about 1:2, and more preferably greater than about 1:1. In the illustrated embodiment, a metal-to-metal contact is formed in a via 14 with an aspect ratio between about 3:1 and 4:1. Aspect ratios in future generation integrated circuits will likely be higher still, since parasitic capacitance concerns limit ILD thickness scaling while lateral dimensions continued to be scaled. Conventional photolithography techniques can be employed to define the via 14, and anisotropic etching (e.g., reactive ion etching) is preferred for producing vertical via sidewalls.

The illustrated circuit element exposed by the etch comprises a contact landing pad of an underlying conductive runner or wiring layer 18. The conductive layer 18 preferably comprises copper, aluminum or alloys thereof, though the skilled artisan will appreciate that other conductive materials may be suitable, depending upon the function and desired conductivity of the circuit element. The illustrated embodiment includes an antireflective layer 16 (e.g., TiN), through which the via 14 preferably extends.

Figure 3:
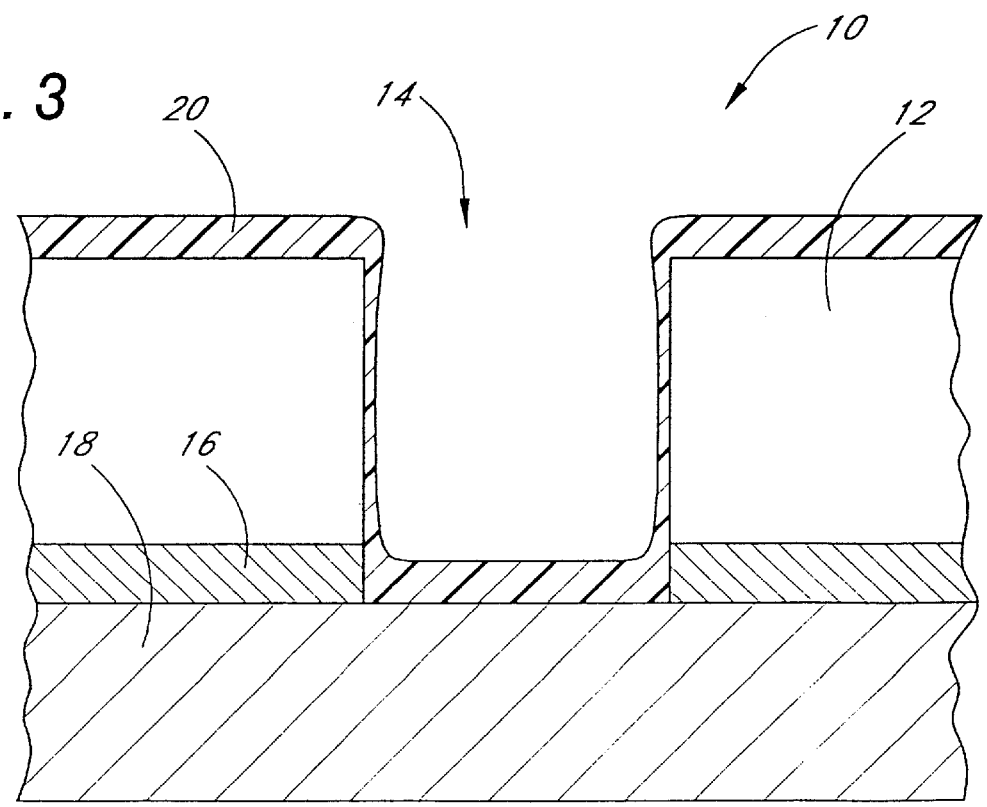
FIG. 3 shows the substrate assembly of FIG. 2 after deposition of an initial metal nitride barrier sub-layer into the via.

With reference to FIG. 3, an initial barrier layer or sub-layer 20 is then deposited over the substrate assembly 10 and onto the sidewalls and floor of the via 14, preferably by PVD, more preferably by the reactive sputtering process described above. The initial barrier sub-layer 20 preferably comprises a metal nitride ($MN_x$) and comprises tungsten nitride ($WN_x$) in the illustrated embodiment. As noted above, the initial barrier sub-layer in other arrangements can comprise $TaSi_xN_y$, $TiSi_xN_y$, or other ternary compounds. The deposited initial barrier sub-layer 20 has a composition suitable for conductive barrier properties and is preferably characterized by a nitrogen-to-metal ratio 1:2 and more preferably about 1:1 (e.g., WN).

Preferably, the initial barrier sub-layer 20 is deposited thickly enough to produce a sidewall thickness of between about 25 Å and 125 Å, more preferably between about 50 Å and 75 Å, and most preferably about 50 Å, depending upon the desired barrier properties. To obtain such a sidewall thickness, the initial barrier sub-layer 20 is deposited to a thickness of between about 200 Å and 300 Å, as measured on the top surfaces of the substrate assembly 10.

Figure 4:
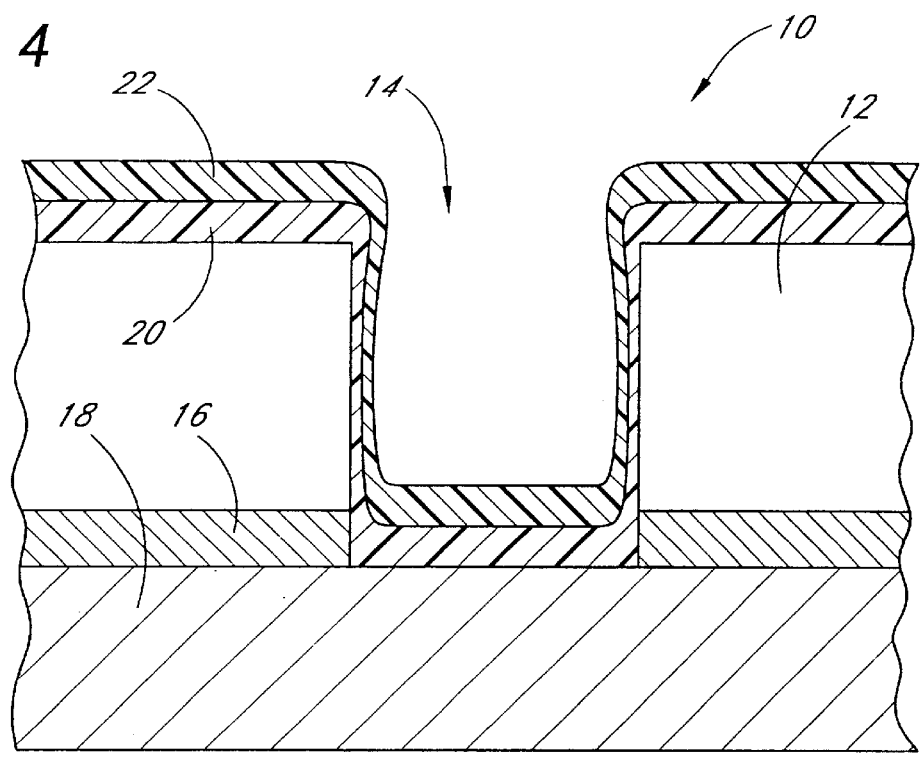
FIG. 4 shows the substrate assembly of FIG. 3 after continued deposition of a second barrier sub-layer, having a greater metal content, into the via and over the initial sub-layer.

Referring to FIG. 4, a second barrier layer or sub-layer 22 is then integrally formed over the initial barrier sub-layer 20, preferably in the same process chamber in which the initial barrier sub-layer 20 was formed and by the preferred second phase of the process described above. The second barrier sub-layer 22 thus has a higher metal content than the initial barrier sub-layer 20. Preferably, the sub-layer 22 is graded to have higher metal content at a top surface than at the interface with the initial barrier sub-layer 20. More preferably, the second sub-layer 22 has a graded composition from a 1:1 nitrogen-to-metal ratio (e.g., WN) at the lower surface to substantially a nitrogen-free composition at the top surface (e.g., substantially pure W). In the illustrated embodiment, the grading is linear, though it will be understood that the graded composition can follow a step function, parabolic, hyperbolic, or other form.

Preferably, the second barrier sub-layer 22 is deposited to produce a sidewall thickness between about 25 Å and 125 Å, more preferably between about 50 Å and 75 Å, and most preferably about 50 Å, depending upon nature of the gradient. To obtain such a sidewall thickness, the initial barrier sub-layer 22 is deposited to a thickness of between about 200 Å and 300 Å, as measured on the top surfaces of the substrate assembly 10.

Advantageously, the graded nitrogen content in the barrier/seed layer, and in the illustrated embodiment in the second barrier sub-layer 22 results in differing grain structures and orientations. Accordingly, grain boundaries at different depths in the sub-layer 22 are unlikely to be aligned. Since grain boundaries provide low resistance to diffusion, the result of the graded barrier is that the overall resistance to diffusion, e.g., of mobile copper atoms, is high. The linearly graded barrier sub-layer 22 thus serves as a particularly effective diffusion barrier.

Figure 5:
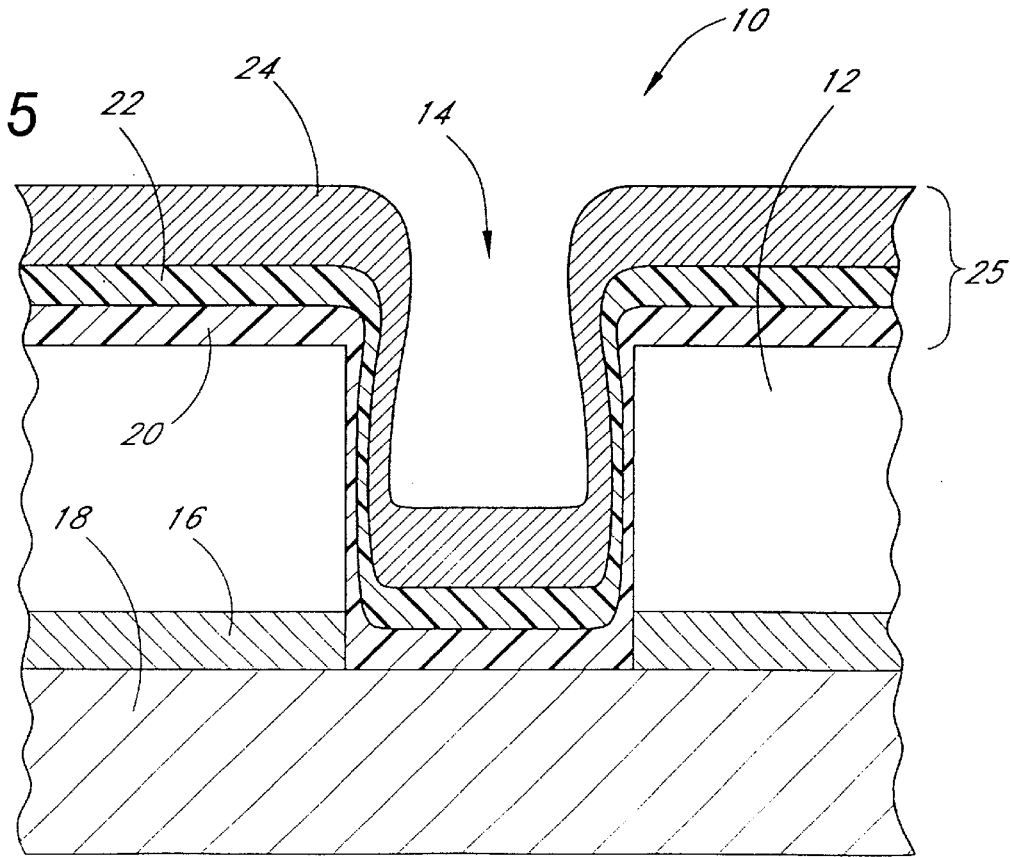
FIG. 5 shows the substrate assembly of FIG. 4 after continued deposition of a third barrier sub-layer, serving as a metal seed layer, into the via and over the second sub-layer, thereby completing the barrier layer.

Referring to FIG. 5, a third barrier layer or sub-layer 24 is formed directly over the second barrier sub-layer 22, preferably in the same process chamber in which the previous sub-layer 22 was formed and by the preferred third phase of the process described above. The third sub-layer 24 is more highly conductive than the underlying portions of the barrier/seed layer, preferably comprising substantially pure metal (e.g., W). It will be understood, of course, that the metal seed layer of the illustrated embodiment may comprise trace amounts of impurities, including nitrogen, and can in other arrangements comprise an alloy (e.g., $TiSi_x$ or $TaSi_x$). In any case, the high conductivity (low resistivity) of this top-most sub-layer 24 allows it serve as a metal seed layer for direct copper electroplating to follow in the illustrated embodiment.

The third barrier sub-layer 24 is preferably deposited to produce a sidewall thickness between about 25 Å and 200 Å, more preferably between about 50 Å and 100 Å, and most preferably about 75 Å, depending upon the available space within the via 14. To obtain the above-identified sidewall thickness, the metal seed layer 24 deposited to a thickness of between about 300 Å and 2,000 Å, more preferably between about 500 Å and 2,000 Å, and most preferably about 750 Å, as measured on the top surfaces of the substrate assembly.

Together, the sub-layers 20, 22, 24 form a barrier/seed layer 25, including a barrier portion made of sub-layers 20, 22 and a seed portion made of sub-layer 24. As noted, the third sub-layer 24 does not primarily serve a barrier function. From a process standpoint, however, the third sub-layer 24 forms an integral part of the barrier layer 25 because it is formed in situ in the same tool as the initial and second sub-layers 20, 22, preferably in a continuous process.

The barrier/seed layer 25, though formed in situ in a single process chamber, is graded from a high nitrogen content lower portion to a low or zero nitrogen content upper portion. In the illustrated embodiment, the barrier/seed layer 25 includes three sub-layers formed in different phases or stages of a continuous deposition process, advantageously reducing manufacturing costs relative to conventional processes. Desirably, the second or middle sub-layer 22 is graded, while the lower sub-layer 20 has a high nitrogen content, preferably with a nitrogen-to-metal content of about 1:1, and the upper sub-layer 24 has a low nitrogen content, preferably zero. Consequently, the upper portions of the barrier layer 25 exhibit higher conductivity than lower portions.

After the barrier layer 25 is formed, the workpiece 10 is removed from the sputtering chamber in preparation for electroplating metal upon the upper surface. In the illustrated embodiment, the exposed surface of the barrier/seed layer 25 (i.e., the third sub-layer 24) comprises substantially pure tungsten, and is accordingly readily oxidized upon exposure to atmospheric oxidants. This native oxide can be optionally precleaned prior to electroplating. Conventional precleaning can be performed, for example, in a dilute hydrofluoric acid (HF) dip. In one arrangement, the workpiece 10 is dipped in a solution of 100:1 dilute HF for about 15–20 seconds.

More preferably, the workpiece 10 is transferred from the sputtering chamber to an electroplating solution without precleaning. The solution can comprise a conventional electroplating solution, including metal sulfate solution and acids. The illustrated embodiment employs copper sulfate. Most preferably, the solution further comprises organic additives to inhibit plating at the top surfaces of the workpiece. Copper electroplating solutions, including organic additives, are commercially available, for example, from Shipley, Inc. of Santa Clara, Calif.

In place of precleaning, native oxide on the exposed metal surface of the barrier/seed layer 25 is reduced in situ by applying a reverse polarity potential to the solution. Preferably, a potential between about 0.5 V and 2 V is applied for a period of between about 5 seconds and 30 seconds.

Figure 6:
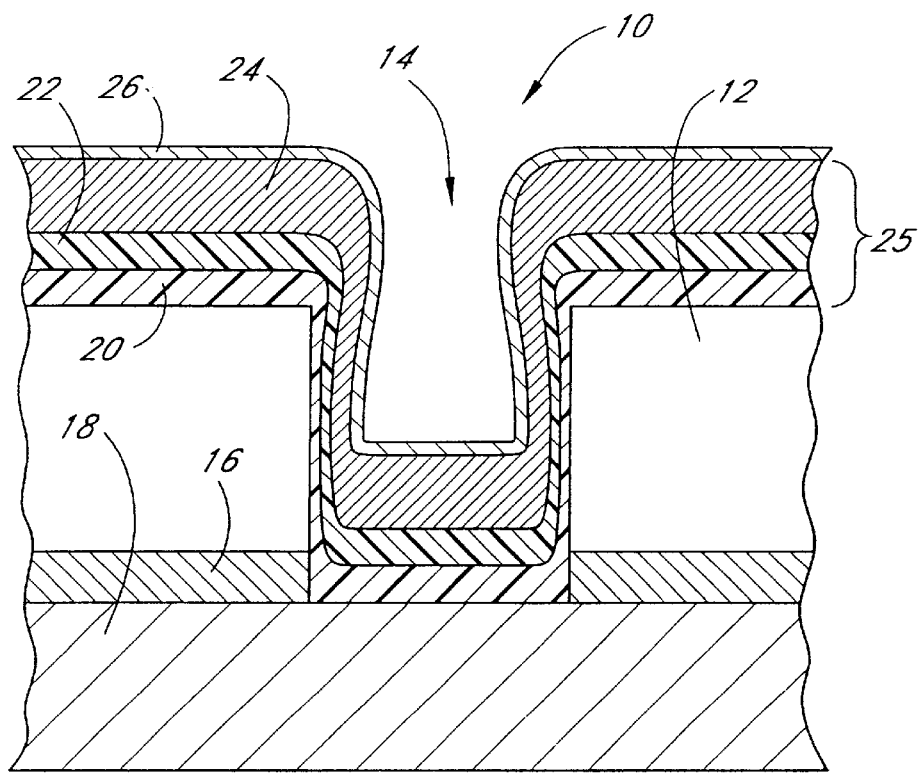
FIG. 6 shows the substrate assembly of FIG. 5 after copper has been directly electroplated onto the metal seed layer or upper portion of the barrier layer.

Referring to FIG. 6, following in situ oxide reduction, polarity is reversed to plate a copper layer 26 on the metal sub-layer 24 of the barrier layer 25. Preferably, copper plating is conducted with direct current, constant current mode. Plating current density is preferably less than about 80 $mA/cm^2$, more preferably between about 5 $mA/cm^2$ and 40 $mA/cm^2$, somewhat lower than densities for more conductive copper seed layers.

Figure 7:
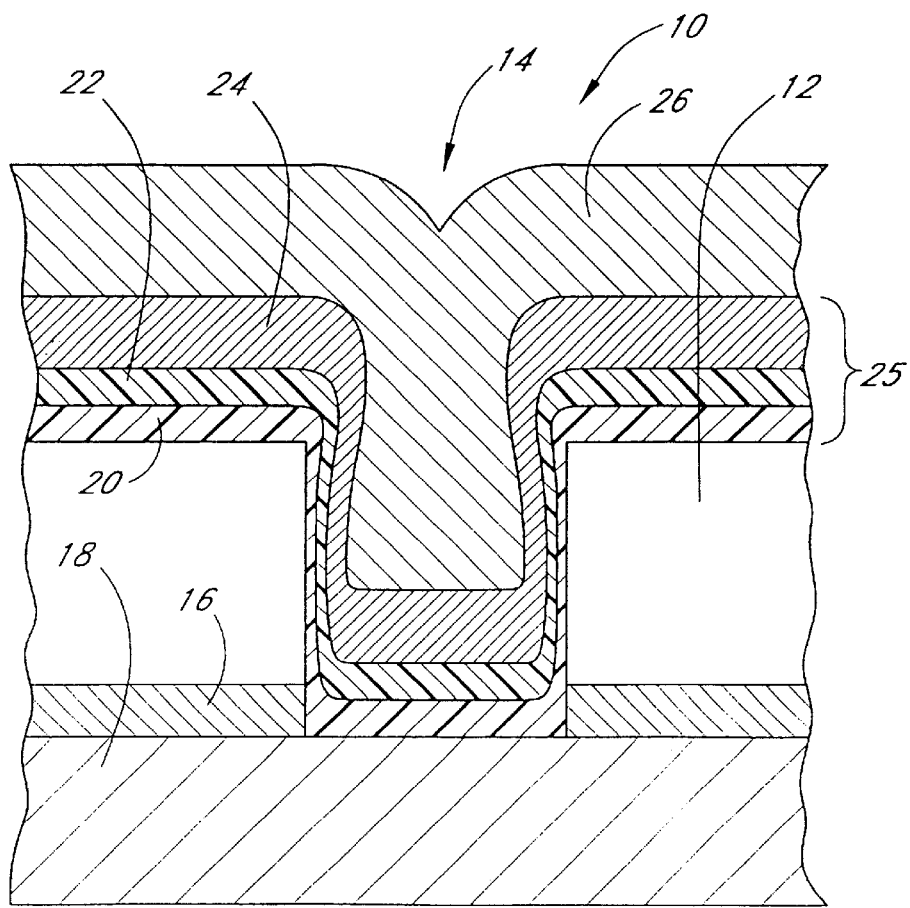
FIG. 7 shows the substrate assembly of FIG. 6 after the via has been filled with copper.

Referring to FIG. 7, plating continues until the copper layer 26 is adequately thick for low resistivity, high speed signal transmission. In the illustrated embodiment, metal ions preferentially plate the inner surfaces of the via 14, in which the large organic molecules do not readily diffuse, and the via 14 is allowed to fill without pinching off. The via 14 is thereby filled, as shown.

Contact formation may be subsequently planarized leave a contact plug, or it may be followed by photolithographic patterning and etching of the layer 26 above the ILD 12. In other arrangements, the opening lined with the barrier/seed layer 25 and plated with copper 26 represents a via, trench or both in damascene or dual damascene processes. In accordance with dual damascene processing, for example, a contact via extends from the bottom of a trench, which has been etched into an ILD in a desired wiring pattern. Following plating, the copper layer 26 is preferably planarized by chemical mechanical polishing (CMP) or other etchback process to leave isolated wiring lines within the trenches.

Although this invention has been described in terms of a certain preferred embodiment and suggested possible modifications thereto, other embodiments and modifications may suggest themselves and be apparent to those of ordinary skill in the art are also within the spirit and scope of this invention. Accordingly, the scope of this invention is intended to be defined by the claims that follow.

I claim:

1. A protective barrier layer interposed between a highly conducting metallic element in an integrated circuit and an interlevel dielectric, the barrier layer comprising a metallic nitride sub-layer having a nitrogen content graded generally linearly from a first concentration adjacent to the interlevel dielectric to about zero adjacent to the metallic element.

2. The barrier layer of claim 1, wherein the first concentration is defined by a metal-to-nitrogen ratio of at least about 1:2.

3. The barrier layer of claim 2, wherein the first concentration is defined by a metal-to-nitrogen ratio of about 1:1.

4. The barrier layer of claim 1, wherein the metallic nitride sub-layer is tungsten nitride.

5. The barrier layer of claim 1, wherein the metallic nitride sub-layer comprises a ternary compound including silicon.

6. The barrier layer of claim 1, further comprising an initial sub-layer interposed between the metallic nitride sub-layer and the interlevel dielectric, the initial sub-layer having a metal-to-nitrogen ratio of about 1:1.

7. The barrier layer of claim 1, further comprising a seed sub-layer interposed between the metallic nitride sub-layer and the highly conductive layer, the seed sub-layer comprising the same metal species as the metallic nitride sub-layer and having a substantially nitrogen-free composition.

8. The barrier layer of claim 7, wherein the seed sub-layer has a thickness of at least about 25 Å.

9. The barrier layer of claim 1, wherein the highly conductive layer comprises a copper layer.

10. The barrier layer of claim 1, wherein the barrier layer comprises:
    a tungsten nitride sub-layer adjacent to the interlevel dielectric, having a nitrogen-to metal ratio of about 1:1;
    a graded tungsten nitride sub-layer adjacent to the tungsten nitride sub-layer, having a nitrogen-to-metal ratio ranging from about 1:1 to about 0:1; and
    a substantially pure tungsten sub-layer adjacent to the graded tungsten nitride sub-layer.

11. A protective barrier layer interposed between a highly conducting metallic element in an integrated circuit and an interlevel dielectric, the barrier layer comprising a metallic nitride sub-layer having a nitrogen content graded generally in a plurality of steps from a first concentration adjacent to the interlevel dielectric to about zero adjacent to the metallic element.

12. A protective barrier layer interposed between a highly conducting metallic element in an integrated circuit and an interlevel dielectric, the barrier layer comprising a metallic nitride sub-layer having a metal content graded in a generally exponential manner from a first concentration adjacent to the interlevel dielectric to a much higher concentration adjacent to the metallic element.

13. An integrated circuit comprising a wiring structure within an opening formed in an insulating layer, the wiring structure comprising:
    a barrier portion including a first metal nitride sub-layer and a second metal nitride sub-layer contacting the first metal nitride;
    a metal seed layer directly overlying the second metal nitride sub-layer of the barrier portion, the metal seed layer comprising the same metal as the metal nitride sub-layer, wherein the second metal nitride sub-layer has a nitrogen content varying generally linearly or in a plurality of steps from a first concentration at the first metal nitride sub-layer to the metal seed layer having substantially zero nitrogen content; and
    a copper layer directly overlying the metal seed layer.

14. The integrated circuit of claim 13, wherein the second metal nitride sub-layer has a nitrogen-to-metal ratio varying between at most about 2:1 adjacent to the first metal nitride sub-layer and about zero adjacent to the metal seed layer.

15. The integrated circuit of claim 14, wherein the first metal nitride sub-layer has a nitrogen-to-metal ratio of about 1:1.

16. The integrated circuit of claim 13, wherein the first metal nitride sub-layer has a thickness between about 25 Å and 125 Å as measured along the sidewalls of the opening.

17. The integrated circuit of claim 13, wherein the first and second metal nitride sub-layers have a thickness between about 200 Å and 300 Å over upper surfaces of the insulating layer.

18. The integrated circuit of claim 13, wherein the metal seed layer is substantially pure tungsten.

19. The integrated circuit of claim 18, wherein the metal seed layer has a thickness between about 50 Å and 100 Å over sidewalls of the opening.

20. The integrated circuit of claim 19, wherein the metal seed layer has a thickness between about 300 Å and 2,000 Å over upper surfaces of the insulating layer.

21. The integrated circuit of claim 13, wherein the opening has an aspect ratio greater than about 1:1.

22. The integrated circuit of claim 13, wherein the opening has an aspect ratio between about 3:1 and 4:1.

* * * * *

UNITED STATES PATENT AND TRADEMARK OFFICE
CERTIFICATE OF CORRECTION

PATENT NO. : 6,545,357 B2
DATED : April 8, 2003
INVENTOR(S) : Dinesh Chopra

It is certified that error appears in the above-identified patent and that said Letters Patent is hereby corrected as shown below:

<u>Column 3,</u>
Line 49, replace "suicides" with -- silicides --.
Line 58, insert -- of a contact via -- between "2" and "through".

Signed and Sealed this

Sixteenth Day of December, 2003

JAMES E. ROGAN
*Director of the United States Patent and Trademark Office*